(12) United States Patent
Moden et al.

(10) Patent No.: US 6,890,384 B2
(45) Date of Patent: May 10, 2005

(54) APPARATUS AND METHOD FOR MODIFYING THE CONFIGURATION OF AN EXPOSED SURFACE OF A VISCOUS FLUID

(75) Inventors: Walter L. Moden, Meridian, ID (US); Syed S. Ahmad, Boise, ID (US); Gregory M. Chapman, Meridian, ID (US); Tongbi Jiang, Boise, ID (US)

(73) Assignee: Micron Technology, INC, Boise, ID (US)

( * ) Notice: Subject to any disclaimer, the term of this patent is extended or adjusted under 35 U.S.C. 154(b) by 0 days.

(21) Appl. No.: 09/944,233

(22) Filed: Aug. 30, 2001

(65) Prior Publication Data

US 2002/0029742 A1 Mar. 14, 2002

Related U.S. Application Data

(63) Continuation of application No. 08/906,578, filed on Aug. 5, 1997, now Pat. No. 6,336,973.

(51) Int. Cl.$^7$ .................................................. B05C 3/00
(52) U.S. Cl. ...................................... 118/406; 118/683
(58) Field of Search ................................. 118/423, 712, 118/406, 682, 683, 412, 411, 410, 694, 612, 684, 501, 429, 669, 679; 427/282, 208.6

(56) References Cited

U.S. PATENT DOCUMENTS

| 2,506,047 | A |   | 5/1950  | Thomas |
| 2,964,007 | A |   | 12/1960 | Buffington |
| 3,713,876 | A |   | 1/1973  | Lavric |
| 3,828,419 | A |   | 8/1974  | Wanner |
| 3,999,479 | A |   | 12/1976 | Zimmer et al. |
| 4,045,863 | A |   | 9/1977  | Mitterhummer et al. |
| 4,300,153 | A |   | 11/1981 | Hayakawa et al. |
| 4,346,124 | A |   | 8/1982  | Wood et al. |
| 4,355,463 | A |   | 10/1982 | Burns |
| 4,360,144 | A |   | 11/1982 | Cuddy et al. |
| 4,526,740 | A |   | 7/1985  | Adams et al. |
| 4,687,693 | A |   | 8/1987  | Sheyon et al. |
| 4,690,999 | A |   | 9/1987  | Numata et al. |
| 4,862,245 | A |   | 8/1989  | Pashby et al. ................ 357/70 |
| 4,876,221 | A |   | 10/1989 | Hatada |
| 4,932,585 | A |   | 6/1990  | Nakamura |
| 4,942,140 | A |   | 7/1990  | Ootsuki et al. |
| 4,959,008 | A |   | 9/1990  | Wasulko |
| 5,030,308 | A |   | 7/1991  | Sheyon et al. |
| 5,049,434 | A |   | 9/1991  | Wasulko |
| 5,066,614 | A |   | 11/1991 | Dunaway et al. |
| 5,105,661 | A |   | 4/1992  | Sekita et al. |
| 5,139,973 | A |   | 8/1992  | Nagy et al. |
| 5,140,404 | A |   | 8/1992  | Fogal et al. |
| 5,164,010 | A |   | 11/1992 | Morozumi |
| 5,183,508 | A |   | 2/1993  | Cholinski |
| 5,185,040 | A |   | 2/1993  | Sakai et al. |
| 5,256,598 | A |   | 10/1993 | Farnworth et al. |
| 5,275,661 | A | * | 1/1994  | Nakagawa et al. |
| 5,286,679 | A |   | 2/1994  | Farnworth et al. .......... 437/209 |
| 5,302,849 | A |   | 4/1994  | Cavasin |
| 5,304,842 | A |   | 4/1994  | Farnworth et al. |

(Continued)

FOREIGN PATENT DOCUMENTS

JP 02037964 A 2/1990

*Primary Examiner*—Brenda A. Lamb
(74) *Attorney, Agent, or Firm*—TraskBritt, PC

(57) ABSTRACT

A method and apparatus for achieving a level exposed surface of a viscous material pool for applying viscous material to at least one semiconductor component by contacting at least a portion of the semiconductor component with viscous material within a reservoir. A level viscous material exposed surface is achieved by using at least one mechanism in association with the reservoir. The mechanism is configured to level the exposed surface of viscous material and maintain the exposed surface at a substantially constant level. The reservoir may be shaped such that the exposed surface of viscous material is supplied to a precise location.

51 Claims, 15 Drawing Sheets

U.S. PATENT DOCUMENTS

| | | |
|---|---|---|
| 5,322,207 A | 6/1994 | Fogal et al. ............. 228/180.5 |
| 5,388,752 A | 2/1995 | Kawakatsu |
| 5,409,863 A | 4/1995 | Newman .................... 437/209 |
| RE35,027 E | 8/1995 | Ragard ........................ 29/740 |
| 5,482,736 A | 1/1996 | Glenn et al. |
| 5,548,160 A | 8/1996 | Corbett et al. ............. 257/666 |
| 5,559,046 A | 9/1996 | Oishi et al. |
| 5,563,443 A | 10/1996 | Beng et al. ................ 257/666 |
| 5,585,282 A | 12/1996 | Wood et al. |
| 5,617,990 A | 4/1997 | Thompson, Sr. ......... 228/180.1 |
| 5,696,033 A | 12/1997 | Kinsman |
| 5,725,143 A | 3/1998 | Leturmy |
| 5,733,800 A | 3/1998 | Moden |
| 5,739,053 A | 4/1998 | Kawakita et al. |
| 5,747,102 A | 5/1998 | Smith et al. |
| 5,769,947 A | 6/1998 | Krappweis |
| 5,773,322 A | 6/1998 | Weld |
| 5,810,926 A | 9/1998 | Evers |
| 5,834,062 A | 11/1998 | Johnson et al. |
| 5,877,542 A | 3/1999 | Ohuchi |
| 5,885,854 A | 3/1999 | Wensel |
| 5,901,899 A | 5/1999 | Flache |
| 5,907,246 A | 5/1999 | Abraham et al. |
| 5,923,957 A | 7/1999 | Song et al. |
| 5,959,347 A | 9/1999 | Grigg et al. |
| 6,010,570 A | 1/2000 | Motoda et al. |
| 6,040,205 A | 3/2000 | Ahmad |
| 6,083,768 A | 7/2000 | Jiang et al. |
| 6,133,068 A | 10/2000 | Kinsman |
| 6,204,093 B1 | 3/2001 | Ahmad |

* cited by examiner

APPARATUS AND METHOD FOR MODIFYING THE CONFIGURATION OF AN EXPOSED SURFACE OF A VISCOUS FLUID

CROSS REFERENCE TO RELATED APPLICATION

This application is a continuation of application Ser. No. 08/906,578, filed Aug. 5, 1997, now U.S. Pat. No. 6,336,973, issued Jan. 8, 2002.

BACKGROUND OF THE INVENTION

1. Field of the Invention

The present invention relates to achieving a level surface on an exposed surface of a viscous fluid. More particularly, the present invention relates to maintaining a level surface on a pool of adhesive material for applying the adhesive material to the lead fingers by contacting the lead fingers with the pool of adhesive material.

2. State of the Art

Higher performance, lower cost, increased miniaturization of semiconductor components, and greater packaging density of integrated circuits are goals of the computer industry. One way to reduce the overall cost of a semiconductor component is to reduce the manufacturing cost of that component. Lower manufacturing costs can be achieved through faster production and/or reduction in the amount of materials used in fabricating the semiconductor component.

One area where faster production and reduction in material usage can be achieved is in the area of lead frame attachment to semiconductor dice. U.S. Pat. No. 5,286,679 issued Feb. 15, 1994 to Farnworth et al. ("the '679 patent"), assigned to the assignee of the present invention and hereby incorporated herein by reference, teaches attaching leads to a semiconductor device with adhesive material in a "lead over-chip" ("LOC") configuration. The '679 patent teaches applying a patterned thermoplastic or thermoses adhesive layer to a semiconductor wafer. The adhesive layer is patterned to keep the "streets" on the semiconductor wafer clear of adhesive for saw cutting and to keep the wire bonding pads on the individual dice clear of adhesive for wire bonding. Patterning of the adhesive layer is generally accomplished by hot or cold screen/stencil printing or dispensing by roll-on. Following the printing and baking of the adhesive layer on the semiconductor wafer, the individual dice are singulated from the semiconductor wafer. During packaging, each adhesive coated die is attached to lead fingers of a lead frame by heating the adhesive layer and pressing the lead fingers onto the adhesive. If the adhesive layer is formed of a thermoses material, a separate oven cure is required. Furthermore, the adhesive layer may be formulated to function as an additional passivating/insulating layer or alpha barrier for protecting the packaged die.

Although the teaching of the '679 patent is an effective method for attaching leads in a LOC configuration, it is difficult to achieve an adequate profile on the adhesive such that there is sufficient area on the top of the adhesive to attach the lead fingers. The process disclosed in the '679 patent is illustrated in FIGS. 23–29. FIG. 23 illustrates a side, cross-sectional view of a semiconductor substrate 302 with a bond pad 304, wherein a stencil or a screen print template 306 has been placed over the semiconductor substrate 302, generally a silicon wafer. The stencil or screen print template 306 is patterned to clear the area around the bond pads 304 and to clear street areas 308 for saw cutting (i.e., for singulating the substrate into individual dice). An adhesive material 310 is applied to the stencil or screen print template 306, as shown in FIG. 24. Ideally, when the stencil or screen print template 306 is removed, adhesive prints 312 are formed with vertical sidewalls 314 and a planar upper surface 316, as shown in FIG. 25. However, since the adhesive material 310 must have sufficiently low viscosity to flow and fill the stencil or screen print template 306, as well as allow for the removal of the stencil or screen print template 306 without the adhesive material 310 sticking thereto, the adhesive material 310 of the adhesive prints 312 will spread, sag, or flow laterally under the force of gravity after the removal of the stencil or screen print template 306, as shown in FIG. 26. This post-application flow of adhesive material 310 can potentially cover all or a portion of the bond pads 304 or interfere with the singulating of the semiconductor wafer by flowing into the street areas 308.

Furthermore, and of even greater potential consequence than bond pad or street interference is the effect that the lateral flow or spread of adhesive material 310 has on the adhesive material upper surface 316. As shown in FIG. 27, the adhesive material upper surface 316 is the contact area for lead fingers 318 of a lead frame 320. The gravity-induced flow of the adhesive material 310 causes the once relatively well-defined well-defined edges 322 of the adhesive material to curve, resulting in a loss of surface area 324 (ideal shape shown in shadow) for the lead fingers 318 to attach to. This loss of surface area 324 is particularly problematical for the adhesive material upper surface 316 at the longitudinal ends 326 thereof At the adhesive material longitudinal ends 326, the adhesive material flows in three directions (to both sides as well as longitudinally), causing a severe curvature 328, as shown in FIGS. 28 and 29. The longitudinal ends of the adhesive print on patch flow in a 180° flow front, resulting in blurring of the print boundaries into a curved perimeter. This curvature 328 results in complete or near complete loss of effective surface area on the adhesive material upper surface 316 for adhering the outermost lead finger closest to the adhesive material longitudinal end 326 (lead finger 330). This results in what is known as a "dangling lead." Since the lead finger 330 is not adequately attached to the adhesive material longitudinal end 326, the lead finger 330 will move or bounce when a wirebonding apparatus (not shown) attempts to attach a bond wire (not shown) between the lead finger 330 and its respective bond pad 304 (shown from the side in FIG. 29). This movement can cause inadequate bonding or non-bonding between the bond wire and the lead finger 330, resulting in the failure of the component due to a defective electrical connection.

LOC attachment can also be achieved by attaching adhesive tape, preferably insulative, to an active surface of a semiconductor die, then attaching lead fingers to the insulative tape. As shown in FIG. 30, two strips of adhesive tape 410 and 410' are attached to an active surface 412 of a semiconductor die 404. The two adhesive tape strips 410, 410' run parallel to and on opposing sides of a row of bond pads 406. Lead fingers 402, 402' are then attached to the two adhesive tape strips 410, 410', respectively. The lead fingers 402, 402' are then electrically attached to the bond pads 406 with bond wires 408. Although this method is effective in attaching the lead fingers 402, 402' to the semiconductor die 404, this method is less cost effective than using adhesive since the cost of adhesive tape is higher than the cost of adhesive material. The higher cost of the adhesive tape is a result of the manufacturing and placement step which are required with adhesive tapes. The individual tape segments are generally cut from a larger tape sheet. This cutting requires precision punches with extremely sharp and accurate edges. These precision punches are expensive and they wear out over time. Furthermore, there is always waste between the segments which are punched out, resulting in high scrap cost. Moreover, once punch out is complete, the tape segments are placed on a carrier film for transport to the die-attach site. Thus, there are problems with placement, alignment, and attachment with film carriers, plus the cost of the film carrier itself. LOC attachment can further be achieved by placing adhesive material on the lead fingers of the lead frame rather than on the semiconductor substrate. As shown in FIG. 31, the adhesive material 502 may be spray applied on an attachment surface 504 of lead fingers 506. However, the viscous nature of the adhesive material 502 results in the adhesive material 502 flowing down the sides 508 of the lead finger 506 and collecting on the reverse, bond wire surface 510 of the lead finger 506, as shown in FIG. 32. The adhesive material 502 which collects and cures on the bond wire surface 510 interferes with subsequent wirebonding, which, in turn, can result in a failure of the semiconductor component. The flow of adhesive material 502 for the attachment surface 504 to the bond wire surface 510 can be exacerbated if the lead fingers 506 are formed by a stamping process rather than by etching, the other widely employed alternative. The stamping process leaves a slight curvature 512 to edges 514 of at least one surface of the lead finger 506, as shown in FIG. 33. If an edge curvature 512 is proximate the lead finger attachment surface 504, the edge curvature 512 results in less resistance (i.e., less surface tension) to the flow of the adhesive material 502. This, of course, results in the potential for a greater amount of adhesive material 502 to flow to the bond wire surface 510.

Furthermore, present methods of adhesive material application on a surface (whether of the semiconductor die or the lead fingers) tend to waste adhesive material. For example, spray application loses a great deal of adhesive material because not all of the sprayed adhesive material attaches to the target surface. As another example, the patterning of an adhesive layer on a semiconductor die, such as described in the '679 patent, results in a substantial area of the adhesive pattern not being utilized to attach leads.

Thus, is can be appreciated that it would be advantageous to develop a method and apparatus for rapidly applying an adhesive material to a lead finger with little waste of adhesive material.

SUMMARY OF THE INVENTION

The present invention relates to a method for applying an adhesive material to lead fingers of a lead frame wherein surfaces of the lead fingers which receive the adhesive material face downward to contact a pool of adhesive material. Preferably, the adhesive material cures with the lead frame in this downward facing position. The advantages of placing viscous material, such as an adhesive material, in a downward facing position is described in U.S. patent application Ser. No. 08/709,182, by Tongbi Jiang and Syed S. Ahmad, filed Sep. 6, 1996, assigned to the assignee of the present invention and hereby incorporated herein by reference. An adhesive reservoir retaining the adhesive material can be shaped such that the exposed surface (pool) of the adhesive material is in a precise location. When the lead fingers contact the exposed surface of the adhesive material, the adhesive material attaches to only specific, desired portions of the lead fingers.

Rather than gravitational forces causing the adhesive material to flow and expand as when on top of the lead frame, the gravitational forces on the inverted lead frame maintain the shape and boundary definition of the adhesive material. It is, of course, understood that the viscous adhesive material must be compatible with the lead finger material so as to adhere thereto and must not be of such a low viscosity that it drips when the lead fingers are removed from contact with the adhesive material pool. Preferably, the viscous materials have viscosities between about 1000 cps and 500,000 cps.

Of critical importance to the application of the adhesive material to the lead fingers in the method described above is the levelness of the exposed surface of the adhesive material of the pool. If the exposed surface is not level, the lead fingers may extend too deeply into the adhesive material. When this occurs, the adhesive material may wet sides of the lead finger and may even wet a bond wire surface of the lead finger. If the adhesive material wets the bond wire surface, the adhesive material may interfere with a wirebonding step subsequent to LOC attachment of the lead fingers to an active surface of a semiconductor die.

A preferred method of controlling the levelness of the exposed surface is by attaching a coating stencil having small apertures, such as a screen or a plate with slots, to the adhesive reservoir, such that the only outlet for the adhesive material is through the apertures in the coating stencil. The adhesive material is thus forced through the coating stencil. The surface tension between walls of the small apertures and the adhesive material flattens out the exposed surface of the adhesive material. This allows a larger area to be printed with a more uniform thickness layer than if the coating stencil is not used. It is, of course, understood that the flatness or shape of the adhesive material can be controlled by the design of the apertures of the coating stencil. Thus, the present invention is an efficient way to use the surface tension of the adhesive material to control surface area and thickness of the adhesive material available for application to lead fingers.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
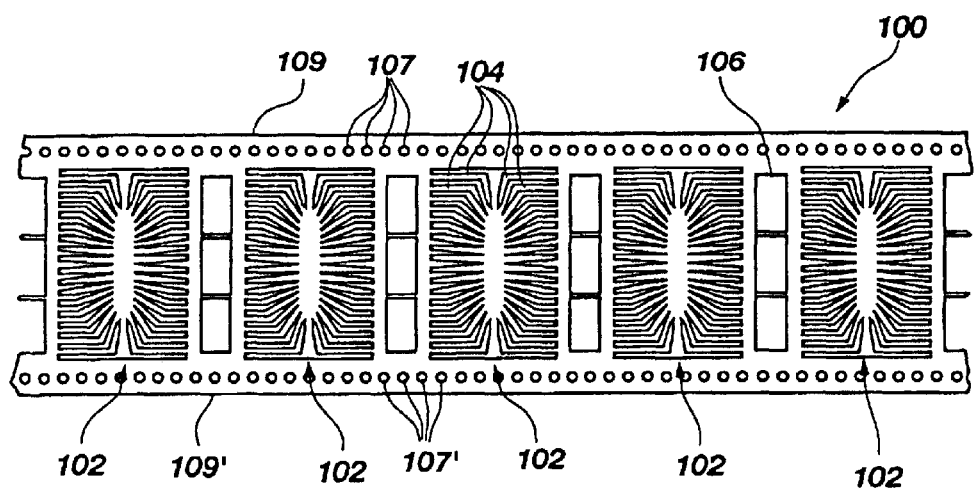
FIG. 1 is a top plan view of a typical lead frame ribbon.

FIG. 1 illustrates a portion of an exemplary lead frame ribbon 100. It should be understood that the figures presented in conjunction with this description are not meant to be actual views of any particular portion of an actual semiconductor device or component, but are merely idealized representations which are employed to more clearly and fully depict the process of the invention than would otherwise be possible. Individual lead frames 102, each including a plurality of lead fingers 104, are formed in a long, thin strip of conductive material 106, such as copper, copper alloy, or the like. The lead frames 102 are generally formed by a stamping process or an etching process. The lead frames 102 are formed side-by-side along the conductive material strip 106 wherein the conductive material strip 106 includes a plurality of indexing holes 107, 107' on opposing lengthwise edges 109, 109', respectively, of the conductive material strip 106. The indexing holes 107, 107' are used to move the lead frame ribbon 100 and align the lead frames 102 throughout a process of attaching the lead frames 102 to semiconductor dice (not shown).

Figure 2:
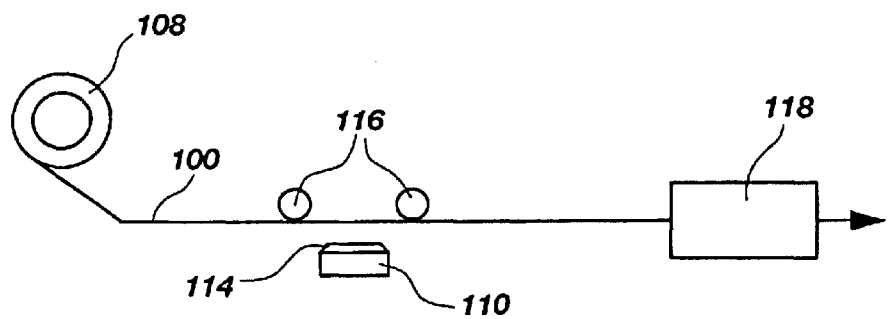
FIGS. 2 and 3 are schematic representations of one process of the present invention.
Figure 3:
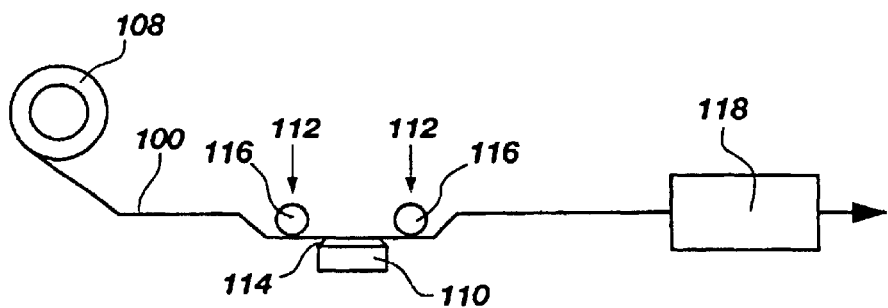

FIGS. 2 and 3 illustrate a schematic of one process of the present invention. Elements common to FIGS. 1, 2, and 3 retain the same numeric designation. The lead frame ribbon 100, such as illustrated in FIG. 1, is fed from a source 108, such as a spool, to an adhesive reservoir 110. As shown in FIG. 3, the lead fingers 104 (not shown) of the lead frame 102 (not shown) are aligned over the adhesive reservoir 110 and the lead frame ribbon 100 is biased downward in direction 112, such as by hydraulic, pneumatic, or electrically-powered biasing mechanisms 116, to contact an adhesive material 114. The adhesive material 114 may be any viscous adhesive material including but not limited to thermoplastics, thermoses resins, flowable pastes, and B-stage adhesive materials. Preferred adhesive materials 114 include cyanate ester, bismaleimide, epoxy, and polyimide.

Figure 4:
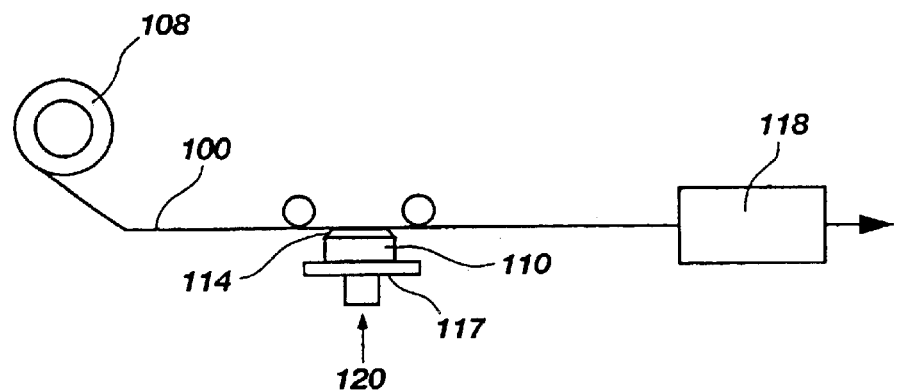
FIG. 4 is a schematic representation of an alternate process of the present invention.

FIG. 4 illustrates a schematic of another process of the present invention which is similar to the process of FIGS. 2 and 3. Elements common to FIGS. 2 and 3 and FIG. 4 retain the same numeric designation. The only difference between the processes of FIGS. 2 and 3 and FIG. 4 is that the process of FIG. 4 employs an elevator mechanism 117 to move the adhesive reservoir 110 in an upward direction 120 to contact the lead fingers 104 rather than biasing the lead frame ribbon 100 downward to the adhesive reservoir 110.

It is, of course, understood that the biasing and elevator mechanisms 116 and 117 shown in FIGS. 2 and 3 are not required to bring the adhesive material 114 into contact with the lead fingers 104. Instead, the lead fingers 104 may be brought into close proximity to the adhesive reservoir 110 and additional adhesive material 114 may be delivered by a pump to the adhesive reservoir 110 to raise the level of the adhesive material 114 to contact the lead fingers 104, or to provide a moving wave or surge of adhesive material traveling across the reservoir 110.

Figure 5:
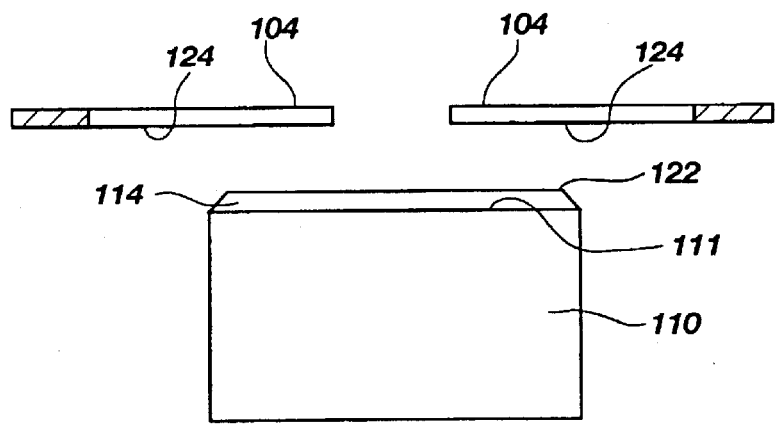
FIGS. 5–7 are side views of a process of contacting lead fingers with an adhesive material according to a method of the present invention.
Figure 6:
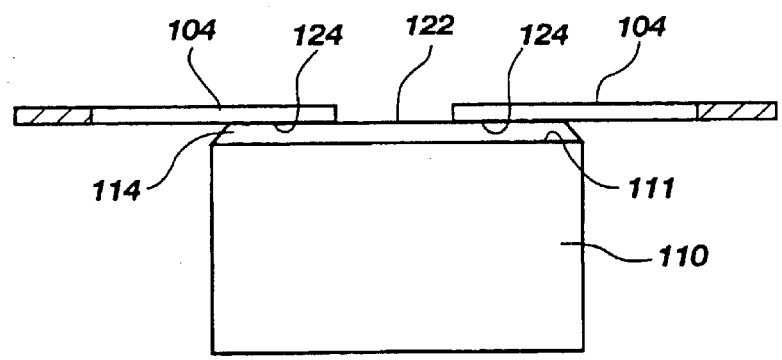
Figure 7:
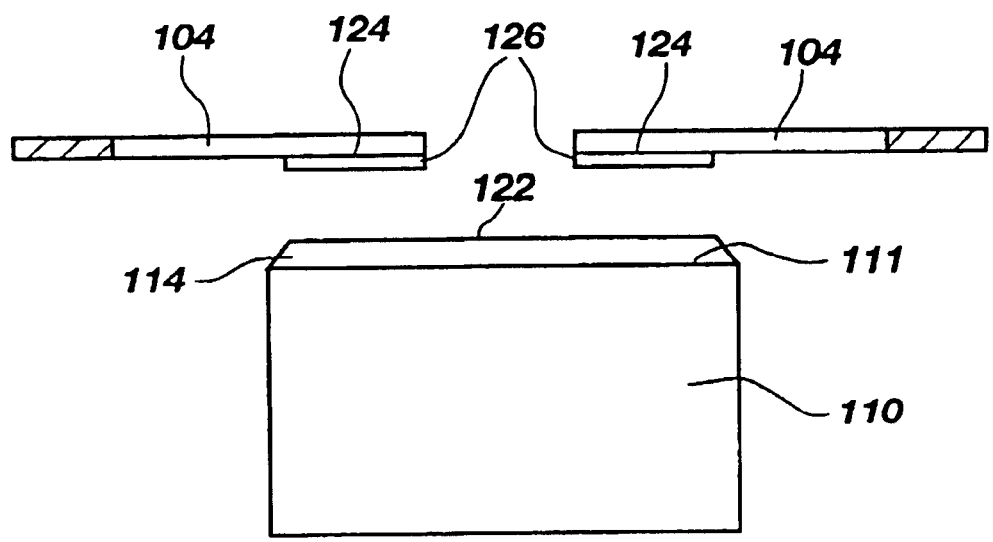

FIGS. 5–7 illustrate side views of the lead fingers 104 being brought into contact with the adhesive material 114 and being retracted therefrom. Elements common to FIGS. 2–4 and FIGS. 5–7 retain the same numeric designation. As shown in FIG. 5, the lead fingers 104 are positioned over the adhesive reservoir 110. The adhesive reservoir 110 has the adhesive material 114 extending above edges 111 of the adhesive reservoir 110. Due to the forces of adhesion and surface tension inherent in the adhesive material 114, an exposed surface 122 of the adhesive material 114 will form a meniscus, or convex-shaped configuration, above the reservoir edges 111.

As shown in FIG. 6, the lead fingers 104 are lowered onto or proximate the exposed surface 122 of the adhesive material 114. When a bottom surface 124 of the lead fingers 104 comes in contact with the exposed surface 122 of the adhesive material 114, the adhesive material 114 wets out across the bottom surface 124 of the lead fingers 104. As shown in FIG. 7, when the lead fingers 104 are retracted from the adhesive material 114, the cohesion of the adhesive material 114 with the lead fingers 104 pulls some of the adhesive material 114 from the bulk of the adhesive material 114 to form an adhesive film 126 on the bottom surface 124 of the lead fingers 104. The thickness of the adhesive film 126 can range from 0.1 to 15 mils, depending on the viscosity of the adhesive material 114. Changing the shape of the lead fingers 104, changing the rheology of the adhesive material 114, pre-coating the lead fingers 104 with a surfactant, such as AMP, or placing a solvent in the adhesive material 114 to improve wetting, and/or adding adhesion promoters, such as silane, siloxane, or polyimide siloxane, to the adhesive material 114 will also change the thickness and/or pattern of the adhesive film 126. It is, of course, understood that the adhesive material 114 must be capable of adhering to the lead fingers 104 and must not be of such a low viscosity that it drips when the lead fingers 104 are removed from contact with the exposed surface 122 of the adhesive material 114.

Figure 8:
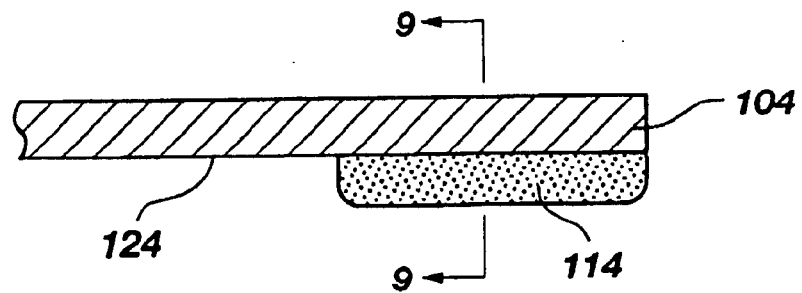
FIG. 8 is a side cross-sectional view of a lead finger after adhesive material attachment according to a method of the present invention.
Figure 9:
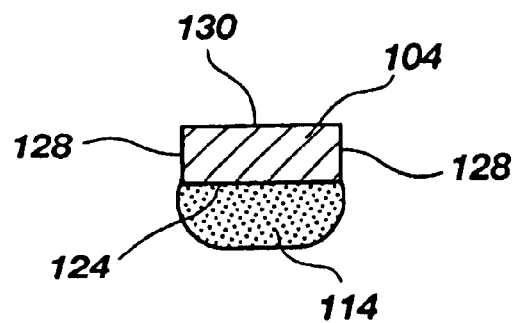
FIG. 9 is a cross-sectional view of a lead finger along line 9—9 of FIG. 8 after adhesive material attachment.

FIG. 8 is a side cross-sectional view of a lead finger 104 after adhesive material 114 application. FIG. 9 is a cross-sectional view of the lead finger 104 of FIG. 8 along line 9—9. As shown in FIGS. 8 and 9, by only contacting the bottom surface 124 of the lead finger 104 with the exposed surface 122 of the adhesive material 114 (see FIG. 6), the adhesive material 114 will not wet sides 128 of the lead finger 104 and, of course, will not collect on a bond wire surface 130 of a lead finger 104 (the bond wire surface 130 is the lead finger surface where a bond wire is subsequently attached during further processing). Since the adhesive material 114 does not collect on the bond wire surface 130, there will be no adhesive material 114 to interfere with a subsequent wirebonding step subsequent to LOG attachment of the lead fingers 104 to an active surface of a semiconductor die.

Referring back to FIG. 5, the adhesive reservoir 110 can be shaped such that the exposed surface 122 of the adhesive material 114 is in a precise location. When the lead fingers 104 contact the exposed surface 122 of the adhesive material 114, the adhesive material 114 attaches to only specific, desired portions of the lead fingers 104.

Figure 10:
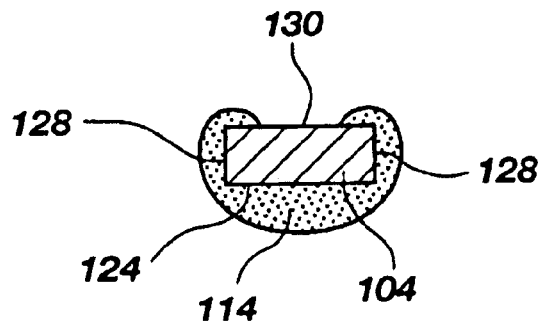
FIG. 10 is a cross-sectional view of a lead finger after adhesive material attachment, wherein the adhesive material exhibits excessive wetting of the lead finger.

It is very important that the exposed surface 122 be as level as possible. If the exposed surface 122 is not level, the lead fingers 104 may extend too deeply into the adhesive material 114. When this occurs, the adhesive material 114 may wet the lead finger sides 128 and may even wet the lead finger bond wire surface 130, as shown in FIG. 10. If the adhesive material 114 wets the bond wire surface 130, the adhesive material 114 may interfere with a wirebonding step subsequent to LOC attachment of the lead fingers 104 to an active surface of a semiconductor die, as mentioned above.

Figure 11:
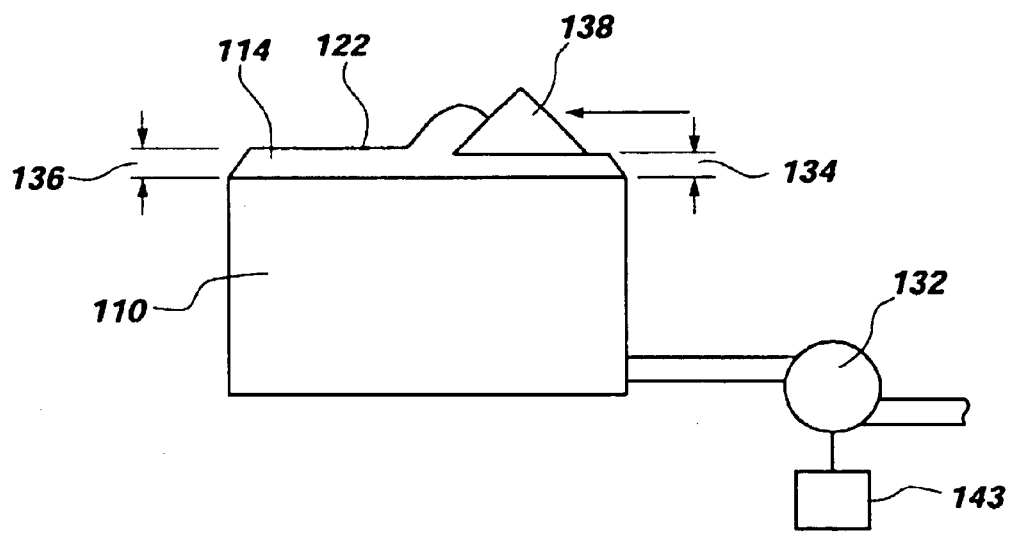
FIG. 11 is a schematic representation of a mechanical mechanism for maintaining the height of an exposed surface of an adhesive material.

Numerous techniques may be used to keep the exposed surface 122 of the adhesive material 114 level. It is, of course, understood that exposed surface 122 extends from the adhesive reservoir 110 due to a slight excess of adhesive material 114 within the adhesive reservoir 110. As shown in FIG. 11, the adhesive material 114 is pumped to the adhesive reservoir 110 from an adhesive material source (not shown) by a pump 132. A desired exposed surface height 134 of exposed surface 122 can be achieved by feeding an excess of adhesive material 114 into the adhesive reservoir 110 such that an initial exposed surface height 136 is higher than the desired exposed surface height 134. A metering mechanism, such as wiper 138, can be utilized to meter the adhesive material 114 from the initial exposed surface height 136 to the desired exposed surface height 134.

Moreover, a desired exposed surface height 134 of exposed surface 122 can be achieved by feeding an excess of adhesive material 114 into the adhesive reservoir 110 such that an initial exposed surface height 136 is higher than the desired exposed surface height 134. The adhesive material 114 is then drawn back (e.g., by vacuum 143), which results in a flattening of the exposed surface 122.

Figure 12:
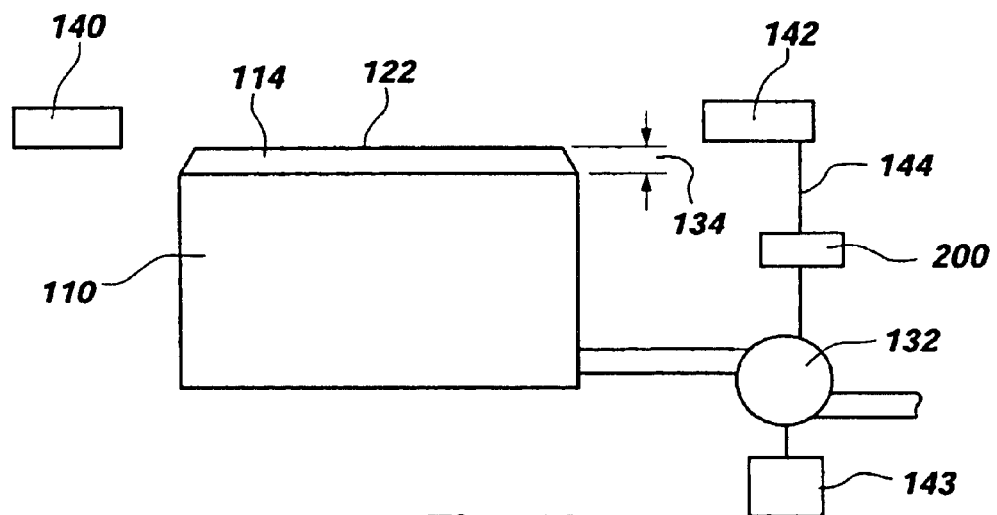
FIG. 12 is a schematic representation of a height detection and control loop for maintaining the height of an exposed surface of an adhesive material.

Furthermore, a variety of feed back and feed forward control schemes may be used to control the desired exposed surface height 134 of the exposed surface 122. One such control scheme is shown in FIG. 12. Elements common to FIG. 11 and FIG. 12 retain the same numeric designations. A height detection mechanism, shown as a light (preferably a laser) transmitter 140 and a light receiver 142, is used to determine the height of the exposed surface 122. The control signal 144 triggers the pump 132 to stop or a valve (not shown) to shut when the desired exposed surface height 134 is achieved.

It is, of course, understood that precise control of the lead frame position relative to the exposed surface 122 is required to accurately control the depth to which the lead fingers 104 are pressed into the adhesive material 114.

Figure 13:
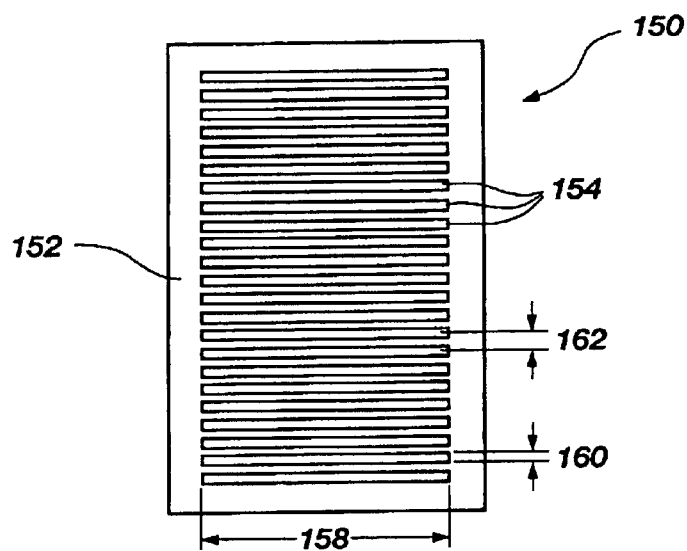
FIG. 13 is a plan view of a coating stencil of the present invention.
Figure 14:
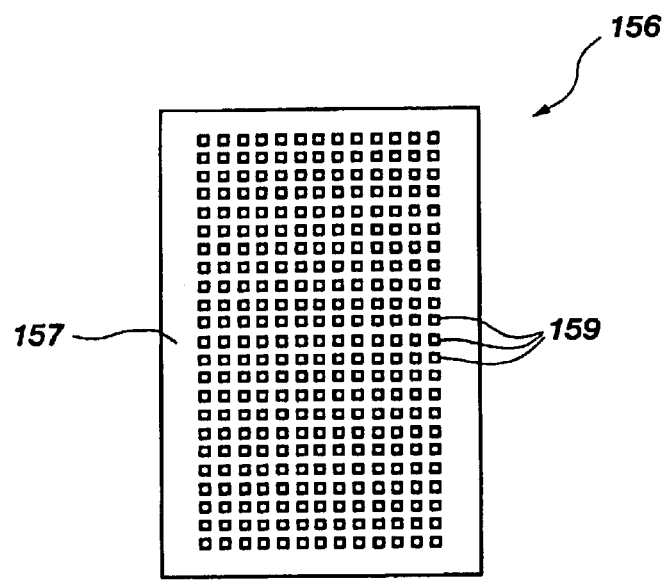
FIG. 14 is a plan view of an alternate coating stencil of the present invention.

A preferred method of controlling the levelness of the exposed surface 122 is by forcing or extruding the adhesive material 114 through a coating stencil having small apertures, such as a screen or a plate with slots. Such a coating stencil 150 is shown in FIG. 13. The coating stencil 150 is a flat plate 152 having a plurality of slots 154. The coating stencil 150 shown has twenty-three parallel slots 154 approximately 0.260 inch in length 158 and approximately 0.010 inch in width 160, with the slots 154 being on parallel centerline pitch 162 of approximately 0.020 inch from one another. An alternate coating stencil 156 is shown in FIG. 14. The coating stencil 156 is a screen comprising a flat plate 157 having a plurality of square or rectangular apertures 159. It is, of course, understood that the apertures may be of any size (depending on the viscosity of the adhesive material) and any shape, including triangles, rectangles, squares, circles, ovals, or the like.

Figure 15:
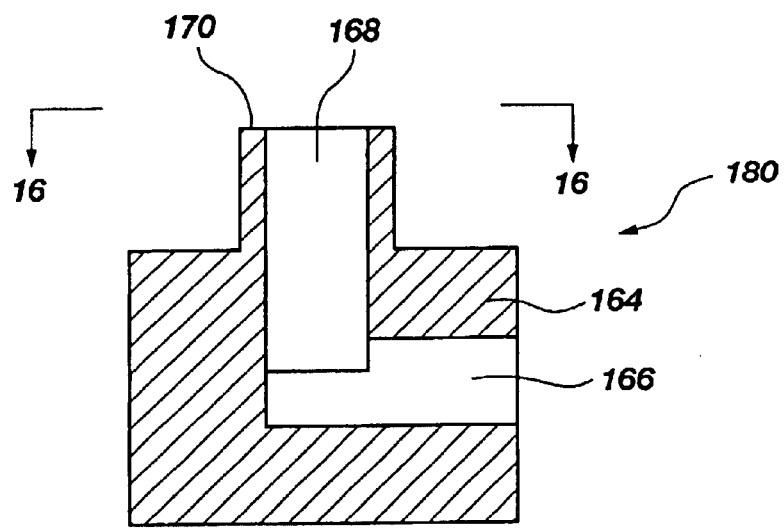
FIG. 15 is a side cross-sectional view of an adhesive reservoir of the present invention.
Figure 16:
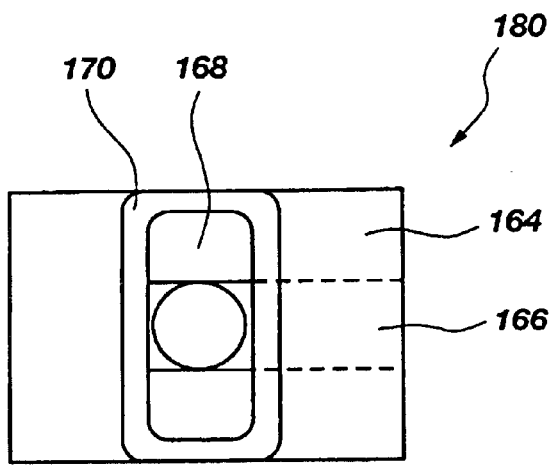
FIG. 16 is a top plan view of the adhesive reservoir of the present invention shown in FIG. 15 along line 16—16.

The coating stencil 150 is attached to an adhesive reservoir 180. The exemplary adhesive reservoir 180, shown in FIGS. 15 and 16 without the coating stencil attached, comprises a housing 164 having an adhesive inflow chamber 166 in fluid communication with a pool chamber 168. The coating stencil 150 is attached proximate an upper surface 170 of the pool chamber 168, such that the only upward outlet for the adhesive material is through the apertures in the coating stencil. It is, of course, understood that the adhesive reservoir 180 may include an adhesive circulation mechanism to circulate the adhesive material to maintain the uniformity thereof.

The cohesion between the aperture (slot) walls (not shown) and the adhesive material 114 flattens out the exposed surface 122 of the adhesive material 114. This allows a larger area to be printed with a more uniform thickness of the adhesive material 114 than if the coating stencil 150 is not used. Put another way, the cohesion between the aperture walls and the adhesive material 114 basically pulls the adhesive material 114 down to the screen surface, which counteracts the force caused by the surface tension of the adhesive material 114. As a result the adhesive material 114 is pulled to the coating stencil 150, thus flattening out. The mathematical formulation for the phenomena is $\Delta p = 2\gamma/R$ where $\Delta p$ is the difference between the pressure within the adhesive material and the ambient air, $\gamma$ is the surface tension of the adhesive material, and R is the radius of curvature when the adhesive material is extruded through the apertures in the coating stencil. R will be about the same for all openings, since $\Delta p$ and $\gamma$ are generally constant for most operations. Since the apertures are small, the extruded material is "flat" with about the same R.

EXAMPLE 1

Figure 17:
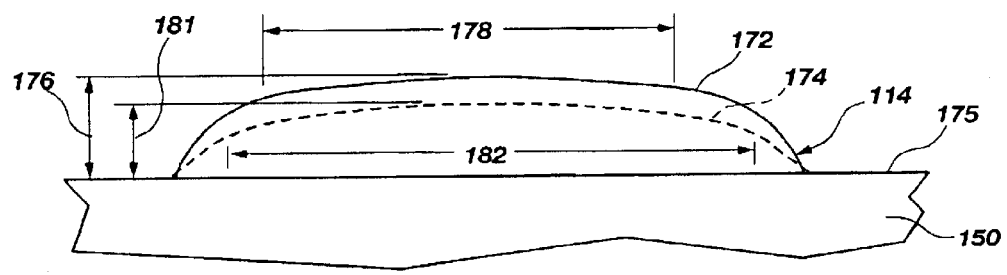
FIG. 17 is a side plan view of stenciled and non-stenciled adhesive material profiles.

An example of the difference between a non-stenciled adhesive material 7 exposed surface 172 and stenciled adhesive material exposed surface 174 is shown in FIG. 17. For this example, the adhesive material 114 was Ablestik XR-041395-9™ Polyimide LOG Adhesive (Ablestik Laboratories, Rancho Dominguez, Calif.) and the coating stencil 150 was as described above for FIG. 13. Ablestik XR-041395-9™ has a viscosity of 62,000 cps at 25° C. and a thixotropic index of 3.5. It is, of course, understood that the width, length, pitch and shape of the apertures in the coating stencil will vary for different viscosities of adhesive materials. A rule of thumb for determination of aperture size is that, for every viscosity increase of 25%, the aperture size should decrease by 50%.

The illustration in FIG. 17 is an AutoCad™ program rendering of a digitized measurement of the non-stenciled adhesive material exposed surface 172 and stenciled adhesive material exposed surface 174. The maximum height 176 of the non-stenciled adhesive material exposed surface 172 was approximately 0.07 inch above an upper surface 175 of the coating stencil 150 and the effective adhesion surface 178 of the non-stenciled adhesive material exposed surface 172 was approximately 0.26 inch wide. The maximum height 181 of the stenciled adhesive material exposed surface 174 was approximately 0.05 inch and the effective adhesion surface 182 of the stenciled adhesive material exposed surface 174 was approximately 0.33 inch wide. Thus, the use of a coating stencil 150 resulted in an increase of effective adhesion surface of about 21.2%. The effective adhesion surfaces 178, 182 are determined as the area from the maximum height 176, 181 of the non-stenciled adhesive material exposed surface, 172 and stenciled adhesive material exposed surface 174, to a position about 5 mils below the maximum height 176, 181.

Figure 18:
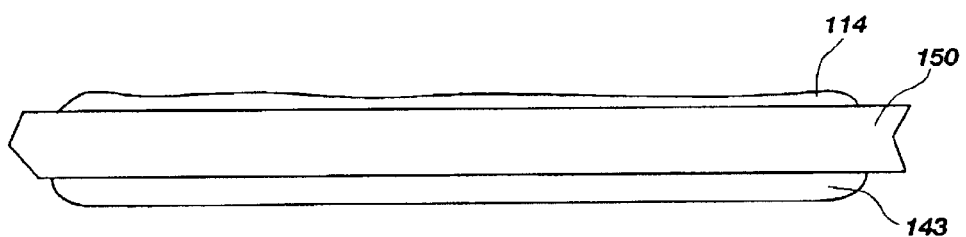
FIG. 18 is a side plan view of a stenciled adhesive material profile after the induction of a vacuum.

It has also been found that an even more uniform profile for the exposed surface can be achieved by inducing a slight vacuum on a bottom side of the coating stencil 150 by any known technique. FIG. 18 illustrates such a profile using the same adhesive material 114 and coating stencil 150 described in FIG. 17, wherein a vacuum of between about 2 and 3 inches of $H_2O$ is applied. The vacuum method provided a very uniform coating at between about 0.02 and 0.03 inch in adhesive material height.

EXAMPLE 2

Figure 19:
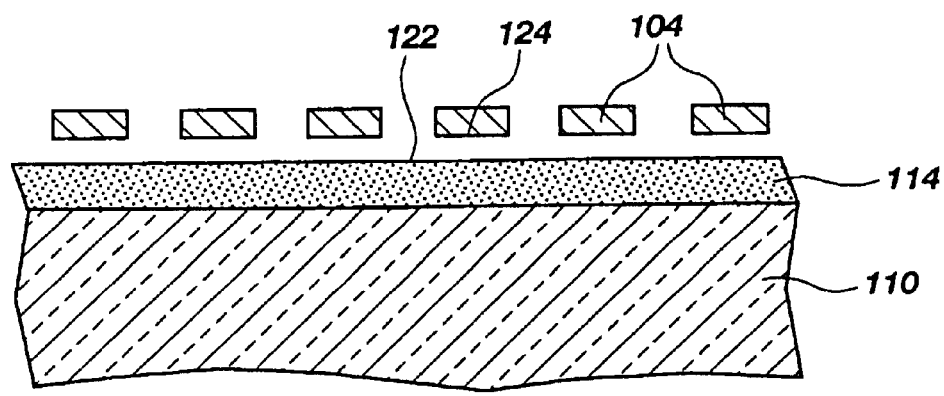
FIGS. 19–21 are side cross-sectional views of a technique of forming an adhesive film on lead fingers according to the present invention.
Figure 20:
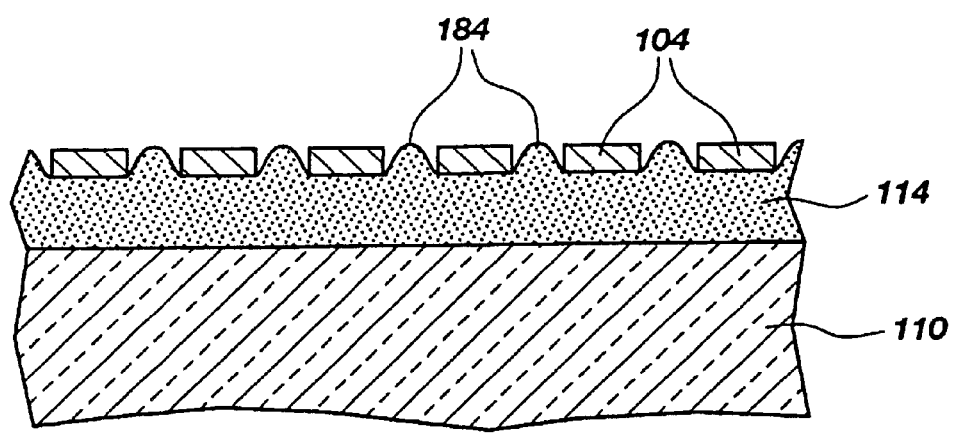
Figure 21:
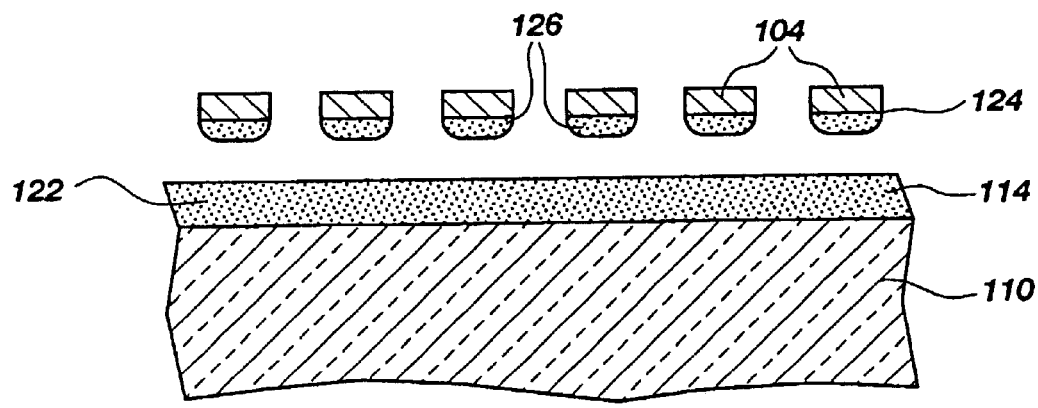

An example of one preferred embodiment of the coating process is illustrated in FIGS. 19–21. Elements common to FIGS. 19–21 and previous FIGS. retain the same designations. As shown in FIG. 19, the lead fingers 104 are brought into close proximity to the adhesive material exposed surface 122. Sufficient adhesive material 114 is then delivered to the adhesive reservoir 110 until the adhesive material exposed surface 122 comes in contact with the bottom surface 124 of the lead fingers 104. At this point, additional adhesive material 114 is delivered to the adhesive reservoir 110 to raise the adhesive material exposed surface 122 about an additional 0.02 to 0.06 inch so that the lead fingers 104 are submerged past a top surface 184 of the adhesive material exposed surface 122, as shown in FIG. 20. The lead fingers 104 remain in this position for a time sufficient to allow the adhesive material 114 to wet the bottom surface 124 of the lead fingers 104, preferably approximately 10 to 25 milliseconds. As shown in FIG. 21, the adhesive material exposed surface 122 is then lowered, thereby forming the adhesive film 126 from the bulk of the adhesive material 114 on the bottom surface 124 of the lead fingers 104. The lead frame ribbon 100 is then indexed to the next site that requires coating. Before the adhesive material 114 is raised again, more adhesive material 114 is delivered, as required, to replenish the amount used in the previous coating cycle.

Figure 22:
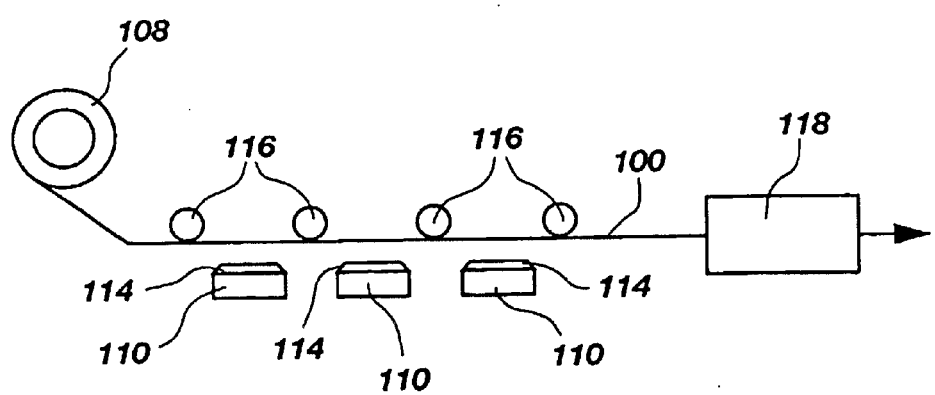
FIG. 22 is a schematic representation of another multiple adhesive material attachment process of the present invention.
Figure 23:
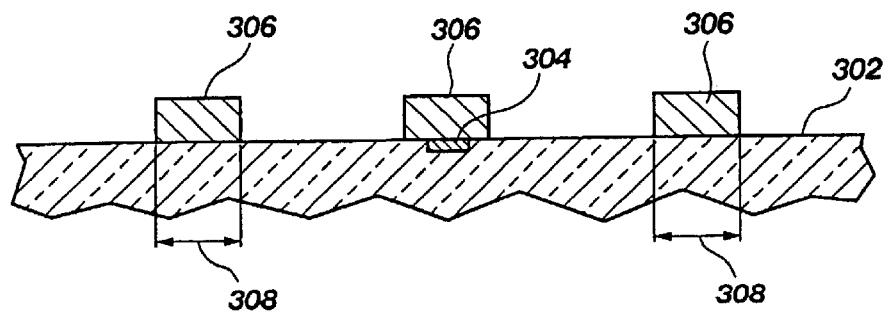
FIGS. 23–29 are side cross-sectional views of a prior art technique of forming adhesive areas on a substrate for LOC attachment.
Figure 24:
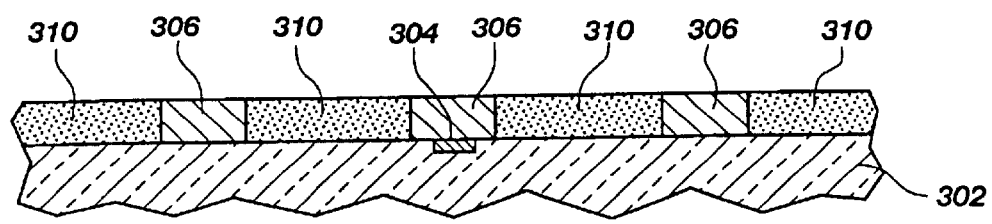
Figure 25:
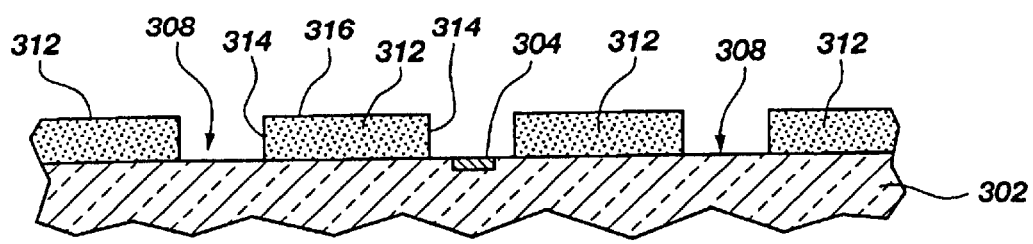
Figure 26:
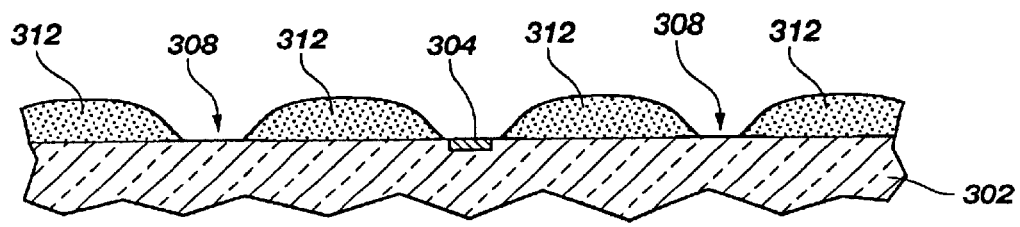
Figure 27:
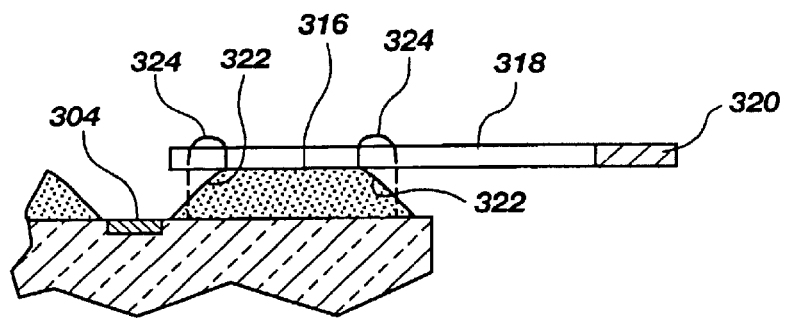
Figure 28:
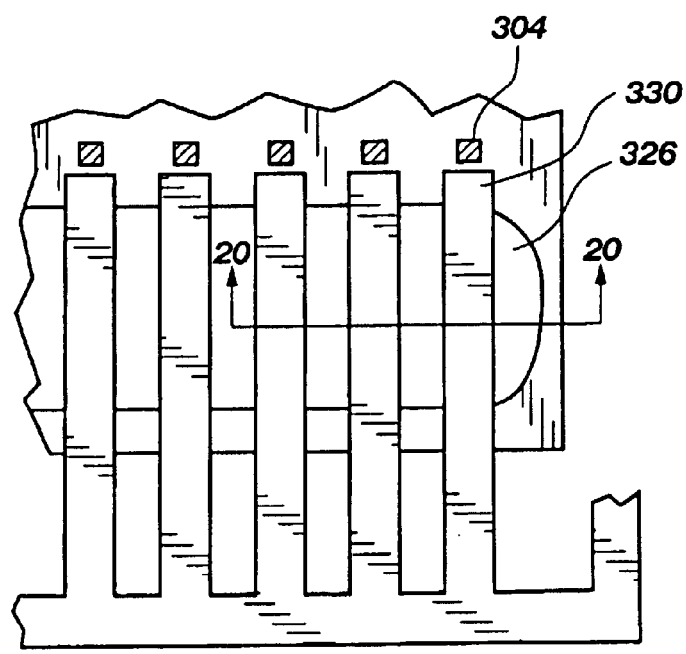
Figure 29:
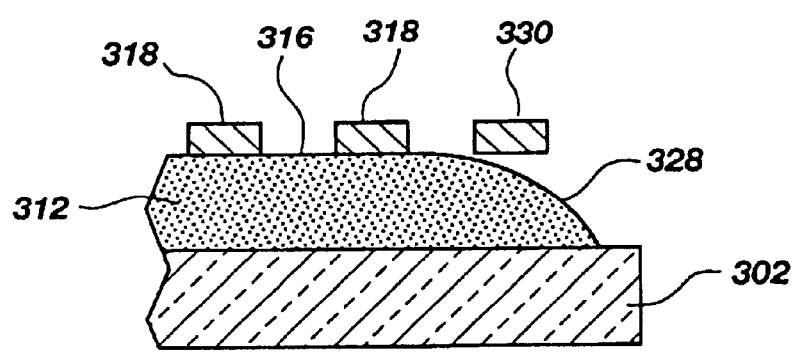
Figure 30:
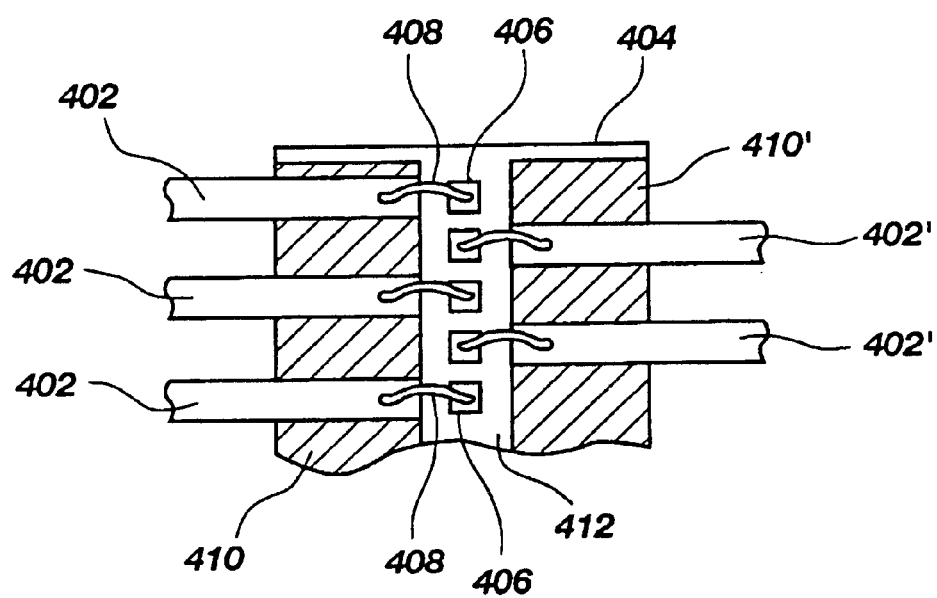
FIG. 30 is a top view of a prior art technique of LOC attachment using adhesive tape.
Figure 31:
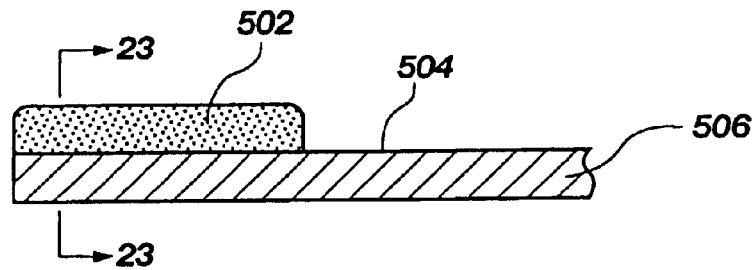
FIGS. 31–33 are side cross-sectional views of a prior art technique of forming adhesive areas on lead fingers for LOC attachment.
Figure 32:
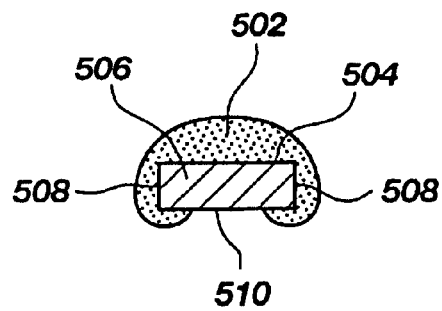
Figure 33:
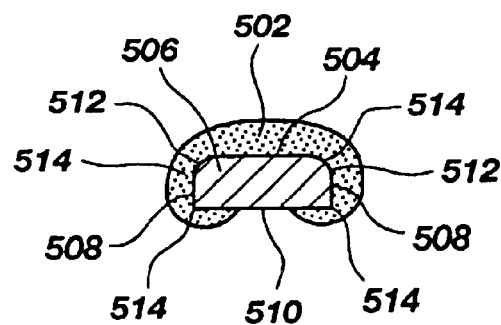

It is also understood that multiple reservoirs 110 could be configured as shown in FIG. 22. With such a configuration, the adhesive material 114 can be applied to the lead fingers 104 of multiple lead frames 102 simultaneously.

Once the adhesive material 114 has been applied to the lead fingers 104, the lead frame ribbon 100 may, optionally, be fed to a curing oven 118, shown in FIGS. 2, 3, 4, and 22, to set the adhesive material 114. A semiconductor die (not shown) then can be attached to a lead frame 102 and adhesive film 126 by known LOC attach methods.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. An apparatus for applying adhesive material to one or more underside surfaces of at least one semiconductor component, comprising:

an adhesive reservoir configured to provide an exposed surface of adhesive material to only a defined portion of each of one or more underside surfaces of at least one semiconductor component positioned thereover, the adhesive reservoir comprising at least one pool chamber defined by at least one upward facing opening, the adhesive reservoir shaped such that the exposed surface of adhesive material is supplied to a precise location above the at least one upward facing opening, the adhesive material having a surface tension; and at least one mechanism associated with the adhesive reservoir, the at least one mechanism configured to level the exposed surface of adhesive material at the precise location above the at least one upward facing opening and maintain the exposed surface of adhesive material at a substantially constant height, the at least one mechanism including a pump configured to supply the adhesive material to the adhesive reservoir and a control system to control the supply of the adhesive material to the adhesive reservoir to control extrusion of the adhesive material to a selectable height.

2. The apparatus of claim 1, wherein the at least one upward facing opening, in combination with the surface tension of the adhesive material, is configured to provide an exposed surface comprising a meniscus.

3. The apparatus of claim 1, wherein the at least one mechanism is configured to manipulate the surface tension of the adhesive material to flatten the exposed surface of the adhesive material.

4. The apparatus of claim 1, wherein the at least one mechanism is further comprised of a coating stencil configured to manipulate a difference in pressure within the adhesive material and ambient air to be equal to twice the surface tension of the adhesive material divided by a radius of curvature of the adhesive material as the adhesive material is extruded through the at least one mechanism.

5. The apparatus of claim 1, wherein the at least one mechanism is configured to use the surface tension of the adhesive material to control surface area and thickness of the adhesive material available for application to the at least one semiconductor component.

6. The apparatus of claim 1, wherein the at least one mechanism further comprises at least one of a coating stencil, a wiper, a vacuum, and a height detection mechanism.

7. The apparatus of claim 1, wherein the at least one mechanism further comprises a coating stencil including:

a generally flat and generally horizontal top surface; and a plurality of apertures aligned to wet the defined portion of the at least one semiconductor component with the adhesive material, the plurality of apertures sized and configured to control extrusion of the adhesive material through the coating stencil to define an area of the exposed surface of the adhesive material.

8. The apparatus of claim 7, wherein the coating stencil is disposed over the at least one upward facing opening of the at least one pool chamber, such that the only access from within the at least one pool chamber through the at least one upward facing opening to above the adhesive reservoir is through the plurality of apertures of the coating stencil.

9. The apparatus of claim 7, wherein the plurality of apertures of the coating stencil is substantially rectangular in shape.

10. The apparatus of claim 7, wherein the plurality of apertures of the coating stencil is substantially square in shape.

11. The apparatus of claim 7, wherein the plurality of apertures of the coating stencil is positioned substantially parallel to each other and is spaced so as to have a centerline pitch between each aperture of the plurality of apertures of 0.020 inch (0.051 cm).

12. The apparatus of claim 11, wherein the plurality of apertures of the coating stencil numbers 23 in quantity.

13. The apparatus of claim 7, wherein the plurality of apertures of the coating stencil is 0.260 inch (0.660 cm) in length and is 0.010 inch (0.025 cm) in width.

14. The apparatus of claim 7, wherein the plurality of apertures of the coating stencil is sized and configured as a result of considering adhesive material viscosity.

15. The apparatus of claim 14, wherein the plurality of apertures of the coating stencil is sized and configured to suit an adhesive material viscosity ranging from approximately 1000 to 500,000 centipoise.

16. The apparatus of claim 14, wherein the plurality of apertures of the coating stencil is sized and configured to optimally accommodate an adhesive material viscosity of approximately 62,000 centipoise.

17. The apparatus of claim 14, wherein the plurality of apertures of the coating stencil is sized and configured to optimally accommodate an adhesive material viscosity of approximately 62,000 centipoise at a temperature of approximately 77° F. (25° C.).

18. The apparatus of claim 7, wherein the plurality of apertures of the coating stencil is arranged generally parallel to each other and is spaced so as to have a centerline pitch between each aperture of the plurality of apertures of 0.020 inch (0.051 cm).

19. The apparatus of claim 18, wherein the plurality of apertures of the coating stencil numbers 23 in quantity.

20. The apparatus of claim 18, wherein the plurality of apertures of the coating stencil is 0.260 inch (0.660 cm) in length and is 0.010 inch (0.025 cm) in width.

21. The apparatus of claim 7, further comprising a vacuum under the coating stencil.

22. The apparatus of claim 1, further comprising at least one second mechanism configured to bring the defined portion of the at least one semiconductor component in contact with the exposed surface of adhesive material.

23. The apparatus of claim 1, wherein the adhesive reservoir further comprises an adhesive circulation mechanism configured to circulate the adhesive material and maintain uniformity of the adhesive material.

24. The apparatus of claim 1, wherein the at least one mechanism is attached to the adhesive reservoir.

25. The apparatus of claim 1, wherein the at least one semiconductor component comprises at least one lead finger on a lead frame.

26. An apparatus for applying viscous material to one or more underside surfaces of at least one semiconductor component, comprising:
 a reservoir for providing an exposed surface of viscous material to only one or more underside surfaces of at least a portion of at least one semiconductor component positioned thereover, the reservoir comprising at least one pool chamber in fluid communication with a viscous inflow chamber, the at least one pool chamber defined by at least one upward facing opening, the reservoir shaped such that the exposed surface of viscous material is supplied to a precise location above the at least one upward facing opening, the viscous material having a surface tension;
 at least one first mechanism configured to provide the viscous material to a desired selectable height above the at least one upward facing opening, the at least one first mechanism comprising at least a pump for supplying the viscous material to the reservoir and a control system for controlling the supply of the viscous material to the reservoir; and
 at least one second mechanism associated with the reservoir, the at least one second mechanism configured to level the exposed surface of viscous material above the at least one upward facing opening, to maintain the exposed surface of viscous material at a substantially constant height and to increase the effective exposed surface of viscous material.

27. The apparatus of claim 26, wherein the exposed surface comprises a meniscus.

28. The apparatus of claim 26, wherein the at least one second mechanism is configured to manipulate the surface tension of the viscous material to flatten out the exposed surface of the viscous material.

29. The apparatus of claim 26, wherein the at least one second mechanism is comprised of a coating stencil configured to manipulate the difference in pressure within the viscous material and ambient air to be equal to twice the surface tension of the viscous material divided by a radius of curvature of the viscous material as the viscous material is extruded through the at least one second mechanism.

30. The apparatus of claim 26, wherein the at least one second mechanism is configured to use the surface tension of the viscous material to control surface area and thickness of the viscous material available for application to the at least one semiconductor component.

31. The apparatus of claim 26, wherein the at least one second mechanism comprises at least one of a coating stencil, a wiper, a vacuum, and a height detection mechanism.

32. The apparatus of claim 26, wherein the at least one second mechanism comprises a coating stencil including:
 a generally planar horizontal top surface; and
 a plurality of openings positioned to wet the at least a portion of the at least one semiconductor component with the viscous material, the plurality of openings sized and configured to control extrusion of the viscous material through the at least one coating stencil to further increase the exposed surface of the viscous material.

33. The apparatus of claim 32, wherein the a coating stencil is disposed over the at least one upward facing opening of the at least one pool chamber, such that the only access from within the at least one pool chamber through the at least one upward facing opening to above the reservoir is through the plurality of openings of the a coating stencil.

34. The apparatus of claim 32, wherein the plurality of openings of the a coating stencil is configured to apply the viscous material to only a selected portion of the at least one semiconductor component.

35. The apparatus of claim 32, wherein the plurality of openings of the a coating stencil is generally rectangular in shape.

36. The apparatus of claim 32, wherein the plurality of openings of the a coating stencil is generally square in shape.

37. The apparatus of claim 32, wherein the plurality of openings of the a coating stencil is positioned generally parallel to each other and is spaced so as to have a centerline pitch between each opening of the plurality of openings of 0.020 inch (0.051 cm).

38. The apparatus of claim 37, wherein the plurality of openings of the a coating stencil numbers 23 in quantity.

39. The apparatus of claim 32, wherein the plurality of openings of the a coating stencil is 0.260 inch (0.660 cm) in length and is 0.010 inch (0.025 cm) in width.

40. The apparatus of claim 32, wherein the plurality of openings of the a coating stencil is sized and configured as a result of considering viscous material viscosity.

41. The apparatus of claim 40, wherein the plurality of openings of the a coating stencil is sized and configured to manage a viscous material viscosity ranging from approximately 1000 to 500,000 centipoise.

42. The apparatus of claim 40, wherein the plurality of openings of the a coating stencil is sized and configured to optimally accommodate a viscous material viscosity of approximately 62,000 centipoise.

43. The apparatus of claim 40, wherein the plurality of openings of the a coating stencil is sized and configured to optimally accommodate a viscous material viscosity of approximately 62,000 centipoise at a temperature of approximately 77° F. (25° C.).

44. The apparatus of claim 32, wherein the plurality of openings of the a coating stencil is arranged generally parallel to each other and is spaced so as to have a centerline pitch between each opening of the plurality of openings of 0.020 inch (0.051 cm).

45. The apparatus of claim 44, wherein the plurality of openings of the a coating stencil numbers 23 in quantity.

46. The apparatus of claim 32, wherein the plurality of openings of the a coating stencil is 0.260 inch (0.660 cm) in length and is 0.010 inch (0.025 cm) in width.

47. The apparatus of claim 32, wherein the at least one first mechanism comprises a vacuum under on a coating stencil.

48. The apparatus of claim 26, further comprising at least one third mechanism configured to bring the at least one semiconductor component in contact with the exposed surface of viscous material.

49. The apparatus of claim 26, wherein the reservoir further comprises a circulation mechanism configured to circulate the viscous material and maintain uniformity of the viscous material.

50. The apparatus of claim 26, wherein the at least one second mechanism is attached to the reservoir.

51. The apparatus of claim 26, wherein the at least one semiconductor component comprises at least one lead finger of a lead frame.

* * * * *

UNITED STATES PATENT AND TRADEMARK OFFICE
CERTIFICATE OF CORRECTION

PATENT NO.        : 6,890,384 B2
APPLICATION NO.   : 09/944233
DATED             : May 10, 2005
INVENTOR(S)       : Moden et al.

It is certified that error appears in the above-identified patent and that said Letters Patent is hereby corrected as shown below:

In column 12, line 43, in Claim 33, before "a" delete "the".

In column 12, line 48, in Claim 33, before "a" delete "the".

In column 12, line 50, in Claim 34, before "a" delete "the".

In column 12, line 54, in Claim 35, before "a" delete "the".

In column 12, line 57, in Claim 36, before "a" delete "the".

In column 12, line 59, in Claim 37, before "a" delete "the".

In column 12, line 64, in Claim 38, before "a" delete "the".

In column 12, line 66, in Claim 39, before "a" delete "the".

In column 13, line 2, in Claim 40, before "a" delete "the".

In column 13, line 5, in Claim 41, before "a" delete "the".

In column 13, line 9, in Claim 42, before "a" delete "the".

In column 13, line 13, in Claim 43, before "a" delete "the".

In column 13, line 18, in Claim 44, before "a" delete "the".

In column 13, line 23, in Claim 45, before "a" delete "the".

UNITED STATES PATENT AND TRADEMARK OFFICE
CERTIFICATE OF CORRECTION

PATENT NO. : 6,890,384 B2
APPLICATION NO. : 09/944233
DATED : May 10, 2005
INVENTOR(S) : Moden et al.

It is certified that error appears in the above-identified patent and that said Letters Patent is hereby corrected as shown below:

In column 14, line 2, in Claim 46, before "a" delete "the".

In column 14, line 6, in Claim 47, after "under" delete "on".

Signed and Sealed this

First Day of April, 2008

JON W. DUDAS
*Director of the United States Patent and Trademark Office*